US008531002B2

(12) United States Patent
Hopper et al.

(10) Patent No.: US 8,531,002 B2
(45) Date of Patent: Sep. 10, 2013

(54) APPARATUS AND METHOD FOR WAFER LEVEL FABRICATION OF HIGH VALUE INDUCTORS ON SEMICONDUCTOR INTEGRATED CIRCUITS

(75) Inventors: Peter J. Hopper, San Jose, CA (US); Peter Johnson, Sunnyvale, CA (US); Kyuwoon Hwang, Palo Alto, CA (US); Andrei Papou, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 322 days.

(21) Appl. No.: 12/899,384

(22) Filed: Oct. 6, 2010

(65) Prior Publication Data

US 2011/0025443 A1   Feb. 3, 2011

Related U.S. Application Data

(63) Continuation of application No. 11/504,972, filed on Aug. 15, 2006, now Pat. No. 7,829,425.

(51) Int. Cl.
*H01L 27/08* (2006.01)

(52) U.S. Cl.
USPC ............. 257/531; 257/E21.022; 257/E27.113

(58) Field of Classification Search
USPC ........... 257/531, E21.022, E27.113; 438/381
See application file for complete search history.

(56) References Cited

U.S. PATENT DOCUMENTS

| 5,204,809 | A |   | 4/1993  | Andersen |
| 5,355,301 | A |   | 10/1994 | Saito et al. |
| 5,541,135 | A |   | 7/1996  | Pfeifer et al. |
| 5,583,474 | A | * | 12/1996 | Mizoguchi et al. ............. 336/83 |
| 5,869,148 | A |   | 2/1999  | Silverscholtz et al. |
| 6,166,422 | A |   | 12/2000 | Qian et al. |
| 6,249,039 | B1 |  | 6/2001  | Harvey et al. |
| 6,452,249 | B1 | * | 9/2002  | Maeda et al. ................. 257/531 |
| 6,462,976 | B1 |  | 10/2002 | Olejniczak et al. |
| 6,867,903 | B2 |  | 3/2005  | Imajuku et al. |
| 6,940,147 | B2 |  | 9/2005  | Crawford et al. |
| 7,232,733 | B2 |  | 6/2007  | Lotfi et al. |
| 7,268,410 | B1 |  | 9/2007  | Hopper et al. |
| 7,652,348 | B1 |  | 1/2010  | Hopper et al. |
| 7,829,425 | B1 |  | 11/2010 | Hopper et al. |

(Continued)

OTHER PUBLICATIONS

Johnson et al., U.S. Appl. No. 11/274,932 entitled "Apparatus and Method for Fabricating High Value Inductors on Semiconductor Integrated Circuits" filed Nov. 14, 2005.

(Continued)

*Primary Examiner* — Robert Huber
(74) *Attorney, Agent, or Firm* — Eugene C. Conser; W. James Brady; Frederick J. Telecky, Jr.

(57) ABSTRACT

An apparatus and method for wafer level fabrication of high value inductors directly on top of semiconductor integrated circuits. The apparatus and method includes fabricating a semiconductor wafer including a plurality of dice, each of the dice including power circuitry and a switching node. Once the wafer is fabricated, then a plurality of inductors are fabricated directly onto the plurality of dice on the wafer respectively. Each inductor is fabricated by forming a plurality of magnetic core inductor members on an interconnect dielectric layer formed on the wafer. An insulating layer, and then inductor coils, are then formed over the plurality of magnetic core inductor members over each die. A plated magnetic layer is formed over the plurality of inductors respectively to raise the permeability and inductance of the structure.

18 Claims, 8 Drawing Sheets

(56) References Cited

U.S. PATENT DOCUMENTS

| | | | |
|---|---|---|---|
| 7,897,472 | B2 | 3/2011 | Hopper et al. |
| 2002/0097129 | A1 | 7/2002 | Johnson |
| 2003/0005569 | A1 | 1/2003 | Hiatt et al. |
| 2004/0263310 | A1 | 12/2004 | Ding et al. |
| 2008/0001699 | A1 | 1/2008 | Gardner et al. |

OTHER PUBLICATIONS

U.S. Appl. No. 10/658,433 entitled "High Density Integrated Inductor with Core" filed Sep. 8, 2003.
Hwang et al., U.S. Appl. No. 11/111,660, "Patterned Magnetic Layer On-Chip Inductor" filed Apr. 21, 2005.
Johnson et al., U.S. Appl. No. 11/137,767 entitled Method of Improving On-Chip Power Inductor Performance in DC-DC Regulators filed May 25, 2005.
U.S. Appl. No. 11/495,143, filed Jul. 27, 2006.
U.S. Appl. No. 11/504,972, filed Aug. 15, 2006.
"The Concise Colour Science Dictionary", Oxford University Press, 1997, p. 708.
Office Action from U.S. Appl. No. 11/495,143, dated Dec. 20, 2007.
Final Office Action from U.S. Appl. No. 11/495,143 dated May 29, 2008.
Office Action from U.S. Appl. No. 11/495,143 dated Aug. 15, 2008.
Office Action from U.S. Appl. No. 11/504,972 dated Nov. 26, 2008.
Office Action dated Apr. 23, 2009 in U.S. Appl. No. 11/495,143.
Final Office Action dated Jun. 23, 2009 in U.S. Appl. No. 11/504,972.
Office Action dated Nov. 20, 2009 in U.S. Appl. No. 11/504,972.
Office Action dated Jul. 22, 2010 in U.S. Appl. No. 12/624,259.
Final Office Action dated May 27, 2010 in U.S. Appl. No. 11/504,972.
Notice of Allowance dated Sep. 21, 2010 in U.S. Appl. No. 11/504,972.
Notice of Allowance dated Nov. 30, 2010 in U.S. Appl. No. 12/624,259.

* cited by examiner

APPARATUS AND METHOD FOR WAFER LEVEL FABRICATION OF HIGH VALUE INDUCTORS ON SEMICONDUCTOR INTEGRATED CIRCUITS

CROSS REFERENCE TO RELATED APPLICATION

This application is a continuation of and claims priority to commonly owned and co-pending U.S. patent application Ser. No. 11/504,972, filed Aug. 15, 2006, and entitled "APPARATUS AND METHOD FOR WAFER LEVEL FABRICATION OF HIGH VALUE INDUCTORS ON SEMICONDUCTOR INTEGRATED CIRCUITS," which is incorporated herein by reference in its entirety and for all purposes.

BACKGROUND

The present invention relates to semiconductor integrated circuits, and more particularly, to an apparatus and method for wafer level fabrication of high value inductors directly on top of semiconductor integrated circuits.

Inductors are commonly used in the electronics industry for storing magnetic energy. An inductor is typically created by providing an electric current though a metal conductor, such as a metal plate or bar. The current passing though the metal conductor creates a magnet field or flux around the conductor. The amount of inductance is measured in terms of Henries. In the semiconductor industry, it is known to form inductors on integrated circuits. The inductors are typically created by fabricating what is commonly called an "air coil" inductor on the chip. The air coil inductor is usually either aluminum or some other metal patterned in a helical, toroidal or a "watch spring" coil shape. By applying a current through the inductor, the magnetic flux is created.

Inductors are used on chips for a number of applications. Perhaps the most common application is direct current to direct current or DC to DC switching regulators. In many situations, however, on chip inductors do not generate enough flux or energy for a particular application. When this occurs, very often an off-chip discrete inductor is used.

There are a number of problems in using off-chip inductors. Foremost, they tend to be expensive. With advances in semiconductor process technology, millions upon millions of transistors can be fabricated onto a single chip. With all these transistors, designers have been able to cram a tremendous amount of functionality onto a single chip and an entire system on just one or a handful of chips. Providing an off-chip inductor can therefore be relatively expensive. Off-chip inductors can also be problematic in situations where space is at a premium. In a cell phone or personal digital assistant (PDA) for example, it may be difficult to squeeze a discrete inductor into a compact package. As a result, the consumer product may not be as small or compact as desired.

An apparatus and method for wafer level fabrication of high value inductors directly on top of semiconductor integrated circuits is therefore needed.

SUMMARY

An apparatus and method for wafer level fabrication of high value inductors directly on top of semiconductor integrated circuits is disclosed. The apparatus and method includes fabricating a semiconductor wafer including a plurality of dice, each of the dice including power circuitry and a switching node. Once the wafer is fabricated, then a plurality of inductors are fabricated directly onto the plurality of dice on the wafer respectively. Each inductor is fabricated by forming a plurality of magnetic core inductor members on an interconnect dielectric layer formed on the wafer. An insulating layer, and then inductor coils, are then formed over the plurality of magnetic core inductor members over each die. A plated magnetic layer is formed over the plurality of inductors respectively to raise the permeability and inductance of the structure.

BRIEF DESCRIPTION OF THE DRAWINGS

Like elements are designated by like reference numbers in the Figures.

DETAILED DESCRIPTION

Figure 1:
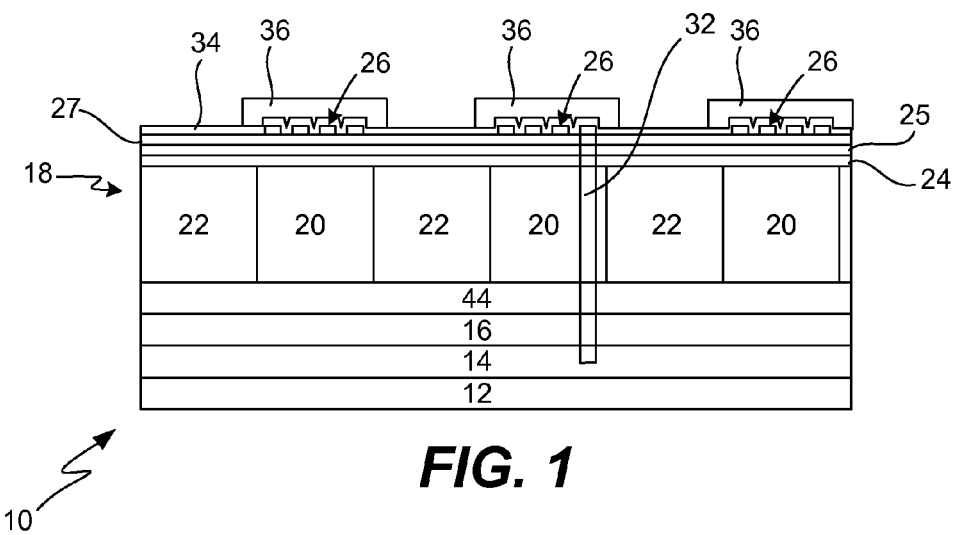
FIG. 1 is a cross section of a semiconductor integrated circuit die with power circuitry fabricated and an inductor fabricated thereon according to the present invention.

Referring to FIG. 1, a cross section of a semiconductor integrated circuit die with power circuitry and an inductor fabricated directly thereon according to the present invention is shown. The die 10 includes a silicon substrate 12 with power circuitry fabricated thereon in accordance with well known semiconductor manufacturing techniques (for the sake of simplicity, the circuitry is not visible in the figure), metal interconnect layer(s) 14 including one or more levels of metal interconnect, and an interconnect dielectric layer 16 formed over the metal interconnect layers 14. An inductor 18 is fabricated directly on a plating layer 44 formed over the interconnect dielectric layer 16. The inductor 18 includes a plurality of magnetic core inductor members 20 provided between resists spacers 22, a planarization surface 24 formed over the inductor members 20 and spacers 22, an insulating layer 25, another plating layer 27, an inductor coil 26, a protective layer 34 formed over the coil 26, and a segmented plated magnetic layer 36 formed over the protective layer 34. An electrical contact 32 is provided between the coil 26 and a switching node (not shown) provided one of the metal layers of interconnect 14.

The present invention is directed to the wafer level fabrication of the inductor 18 directly onto the die 10 in wafer form. FIGS. 2 and 3A through 3G illustrate the fabrication sequence.

Figure 2:
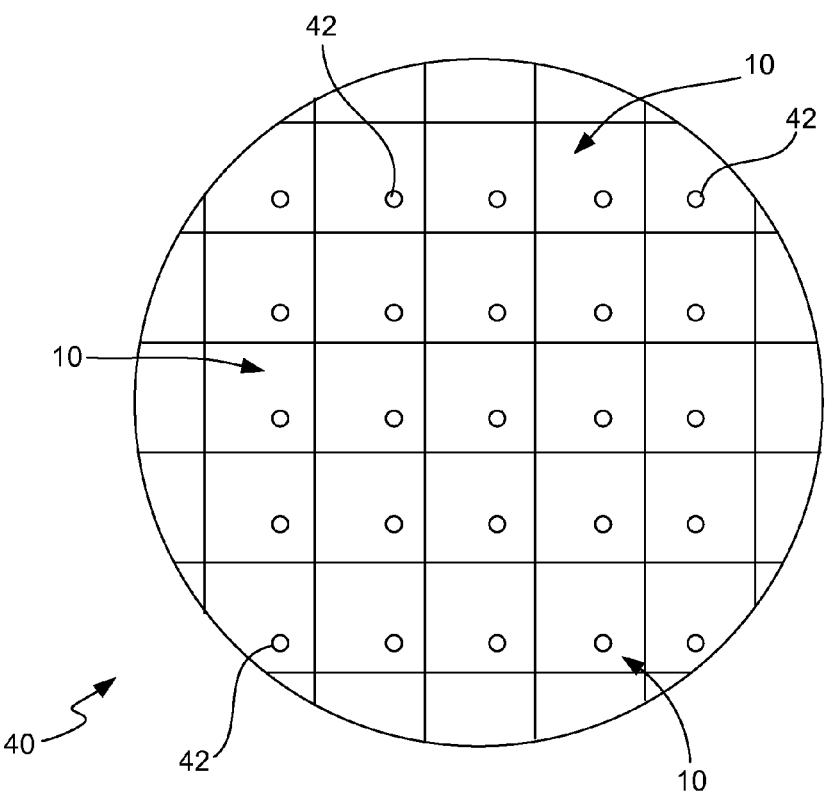
FIG. 2 is a semiconductor wafer including a plurality of dice with power circuitry fabricated thereon according to the present invention.

Referring to FIG. 2, a semiconductor wafer 40 including a plurality of dice 10 is shown. Each die 10 includes power regulation circuitry fabricated thereon, including a switching node 42. For the sake of simplicity, the power regulation circuitry is not shown or described herein. The switching node 42 is typically a metal contact of one of the metal interconnect layers 14. The switching node 42 is in electrical contact with the underlying transistors forming the power regulation circuitry on the device.

In the subsequent discussion with regard to FIGS. 3A through 3F, the wafer level fabrication process for forming the inductor 18 and the top plated magnetic layer 34 on the die 10 is described in detail.

Figure 3A:
FIGS. 3A through 3H are a series of cross sections illustrating the fabrication of the inductors fabricated on the wafer according to the present invention.

Referring to FIG. 3A, a cross section of the wafer 40 is shown. The wafer includes the silicon substrate 12 having the power regulation circuitry fabricated thereon, metal interconnect layers 14, and the interconnect dielectric layer 16 formed over the metal layers 14. The fabrication of the design and fabrication of the power circuitry and metal interconnect levels 14 are well known and therefore are not described in detail herein. The interconnect dielectric layer 16 is formed over the metal layers 14.

The initial step in the fabrication of the inductor 18 involves the forming of a plating layer 44 across the top surface of the wafer 40. The plating layer 44 actually includes three layers, including an underlying oxide protection layer, a middle seed layer, and an upper adhesion layer. In one embodiment, the plating layer 44 is formed by sputtering 300 Angstroms of titanium, 3000 Angstroms of copper, and 300 Angstroms of titanium on the wafer surface to form the protection, seed, and adhesion layers respectively. It should be noted that specific embodiment disclosed herein in merely exemplary, and that a plating layer 44 can be formed using any one of a number of well known techniques and materials and the invention should not be construed as limited to the metals and thicknesses disclosed herein.

Figure 3B:

In the next step as illustrated in FIG. 3B, the photo resist layer 22 is formed over the plating layer 44. In various embodiments, the photo resist layer 22 can be a spin-on BCB or SU8 layer approximately 30 microns thick. Once the resist layer 22 is formed, it is patterned to form recess regions 46 that expose the underlying plating layer 44. The recess regions 44 are formed using well-known photolithography techniques including masking, exposing and etching of the resist layer 22. The recess regions 46 form what are in essence "molds" which will be later used to form the magnetic core inductor members 22.

Figure 3C:

As illustrated in FIG. 3C, the magnetic core inductor members 20 are formed within the molds or recess regions 46 by electroplating. The upper adhesion layer of titanium of the plating layer 44 is stripped away, exposing the underlying copper seed layer. A negative bias or voltage is then applied to the wafer 40 while submerged in a NiFe or a NiFeCo plating bath. During the plating, the recess regions 44 are filed with NiFe or NiFeCo, forming the magnetic core inductor members 20. The recess regions 44 thus define the shape and location of the inductor members 20 on each die on the wafer 40.

Figure 3D:
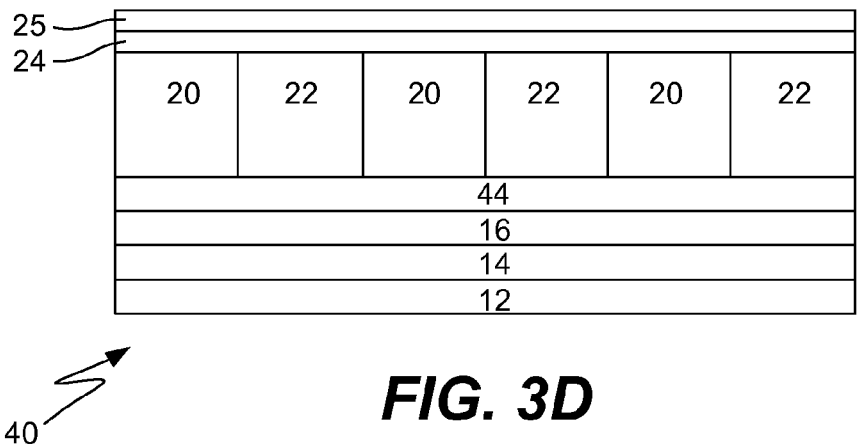

As illustrated in FIG. 3D, the inductor coils 26 are next formed on the wafer surface. After the inductor members 20 are formed, the planarization layer 24 is created across the top surface of the wafer. In one embodiment, the planarization layer 24 is a spin-on layer such as BCB or SU8. Once the layer 24 is formed, it is planarized or smoothed using chemical mechanical polishing (CMP), as is well known in the semiconductor fabrication art. A dielectric insulating layer 25 is next formed across the wafer surface. In various embodiments, the insulating layer 25 is formed by a plasma enhanced chemical vapor deposit of a material such as oxide, nitride or oxynitride, spinning on a polymer such as BCB or SU8, or a chemical vapor deposition of a polymer such as Paralyne.

Figure 3E:
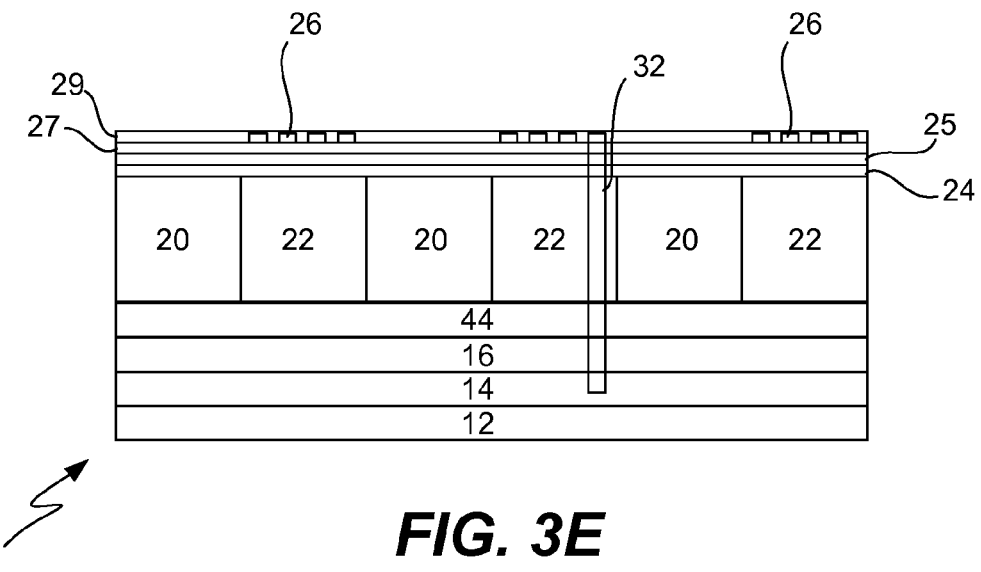

As illustrated in FIG. 3E, the inductor coils 26 are formed is a manner similar to that described above with regard to the inductor members 20. Specifically, another plating layer 27 including an underlying oxidation protection Ti layer, a middle seed copper layer, and an upper adhesion Ti layer, is formed across the wafer surface. Thereafter, a photo resist layer 29 is formed and patterned, forming recess regions, which expose the top adhesive Ti layer. The top adhesion Ti layer is then stripped away, and the wafer 40 undergoes a plating operation in a copper bath. The inductor coils 26 are formed by the plating of copper from the bath onto the exposed seed copper layer within the recess regions. For the sake of brevity, the aforementioned steps are not illustrated in a sequence of figures. The process, however, is essentially the same as that described above, and is therefore not separately illustrated.

In the next step, the electrical contacts 32 are provided between the coils 26 and the underlying switching nodes (not shown) provided one of the metal layers of interconnect 14. The electrical contacts are formed by etching vias into the top surface of the wafer down to the switching node contact 42 of each die 10. The vias are then filled with an electrically conductive material such as aluminum or copper. For the sake of simplicity, only one electrical contact 32 is illustrated in the Figures.

Figure 3F:
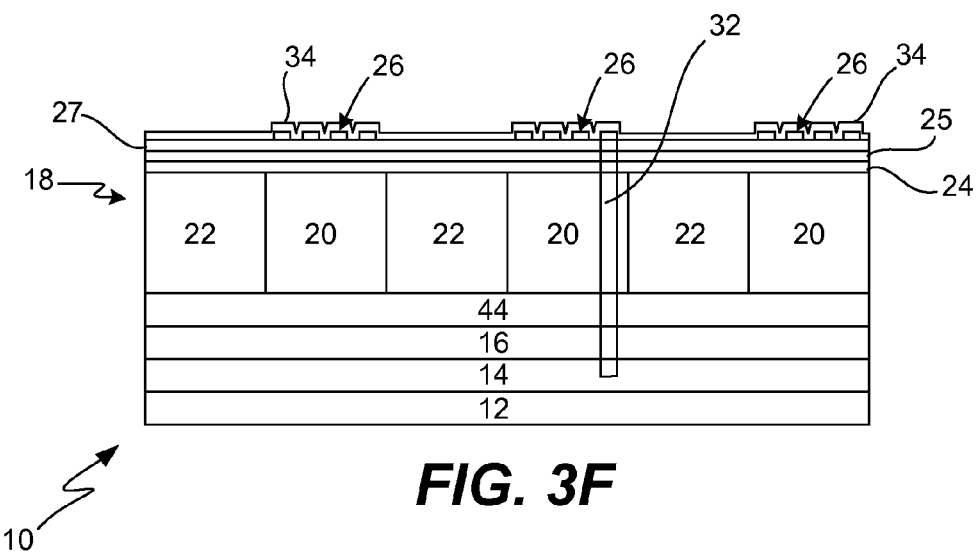
Figure 3G:
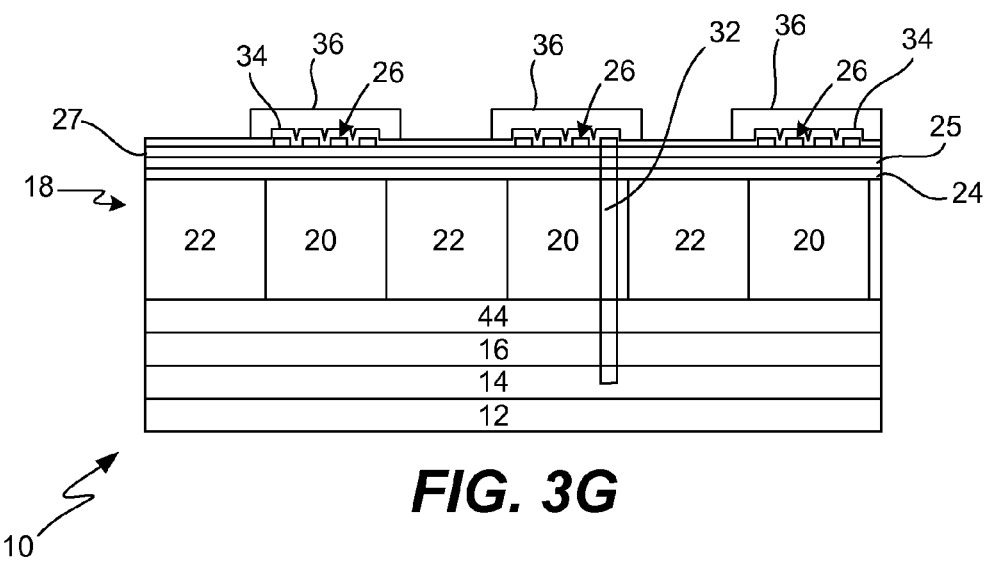

The segmented plated magnetic layer 36 is formed over the protective layer 34 in the next steps as illustrated in FIGS. 3F and 3G respectively. After the electrical contacts 32 are made, the protective layer 34 is next formed. This involves first removing the resist layer 29 used to pattern and form the coil 26. After the resist layer 29 is removed, a protective dielectric material, such as oxide, nitride, or oxy-nitride, is deposited. In one embodiment, the protective layer 34 is deposited to be approximately 1 micron thick. The dielectric material forms the protective layer 34, which electrically isolates the underlying coils 26 from the plated magnetic layer 36.

In the final steps, as illustrated in FIG. 3G, the plated magnetic layer 36 is formed over the protective layer 34. The magnetic layer 36 is fabricated by forming another plating layer (not illustrated) including an underlying oxidation protection Ti layer, a middle seed copper layer, and an upper adhesion Ti layer, across the wafer surface. A resist mask (not illustrated) is then formed and patterned to preclude the electroplating of magnetic material where it is not desired. The top Ti layer of the plating layer is then stripped away in the exposed areas of the resist. Thereafter, the wafer 40 undergoes another electroplating operation in a bath containing a ferromagnetic material, such as NiFe or NiFeCo, resulting in the plating of the magnetic layer 36. In subsequent processing steps, the resist and exposed plating layer are removed, resulting in the structure illustrated in FIG. 3G.

Figure 3H:
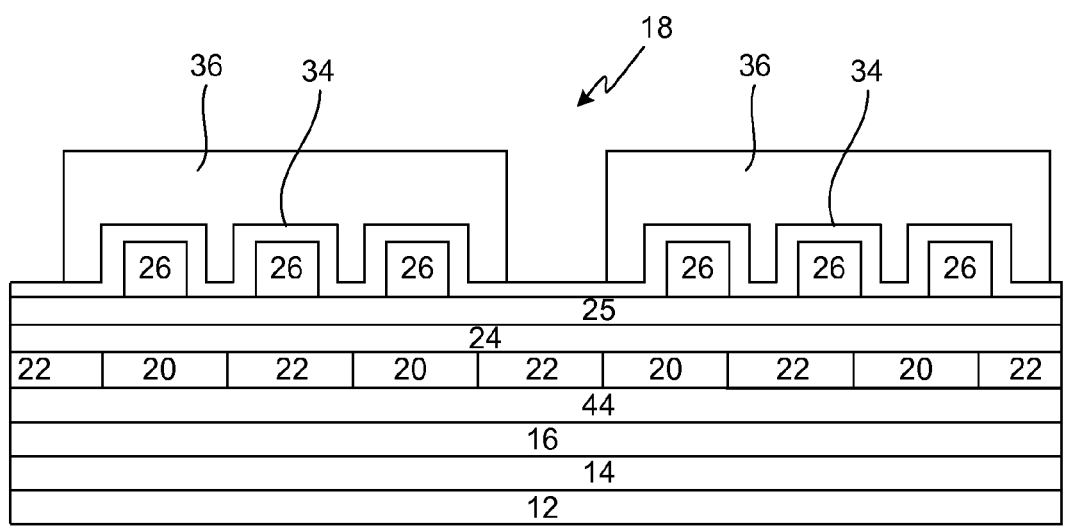

Referring to FIG. 3H, an enlarged cross section view of the final die 10 is shown. The die 10 includes the silicon substrate 12 with the power circuitry fabricated thereon, metal interconnect layers 14, dielectric layer 16, plating layer 44, and an inductor 18 formed on the plating layer 44. The inductor 18 includes magnetic core inductor members 20 formed between resist spacers 22, a planarization surface 24 and insulation layer 25 formed over the inductor members 20 and spacers 22, the inductor coil 26 formed over the insulation layer 25, the protective layer 34, and the segmented plated layer 36 formed over the coils 26 and the protective layer 34.

The ferromagnetic material, sometimes referred to as a permalloy, used to form the magnetic layer 36, serves to raise the relative permeability of the surrounding medium and thus elevate inductance. Generally speaking, the more ferromagnetic material forming the layer 36, the more magnetization will occur, creating a higher level of inductance. In one embodiment, the magnetic layer over the coils 26 is broken into segments to minimize eddy currents and skin related impedance roll off at high frequencies of operation.

Figure 4A:
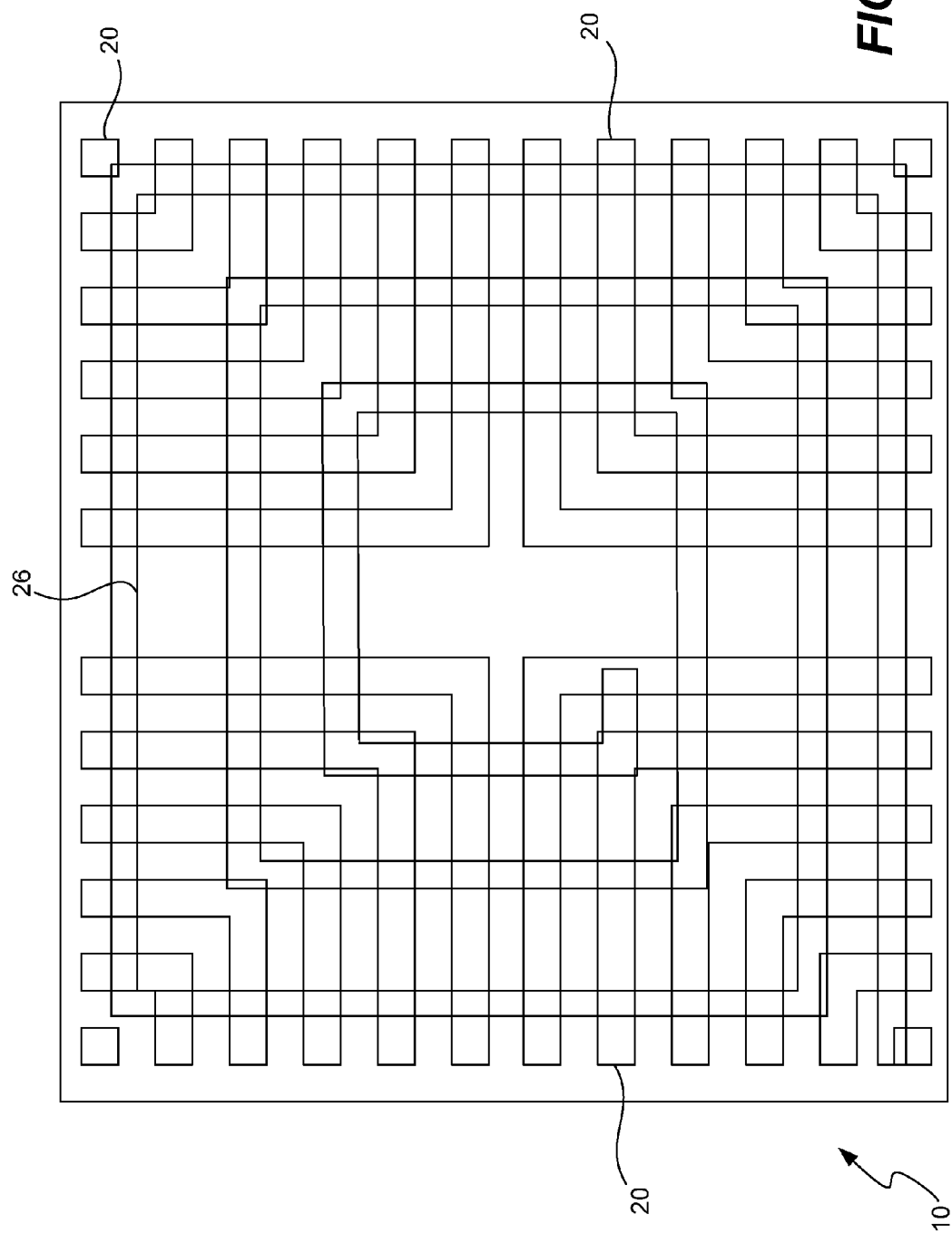
FIGS. 4A and 4B illustrate various pattern arrangements of magnetic core inductors and inductor coils of the inductors fabricated onto the wafer according to the present invention.
Figure 4B:
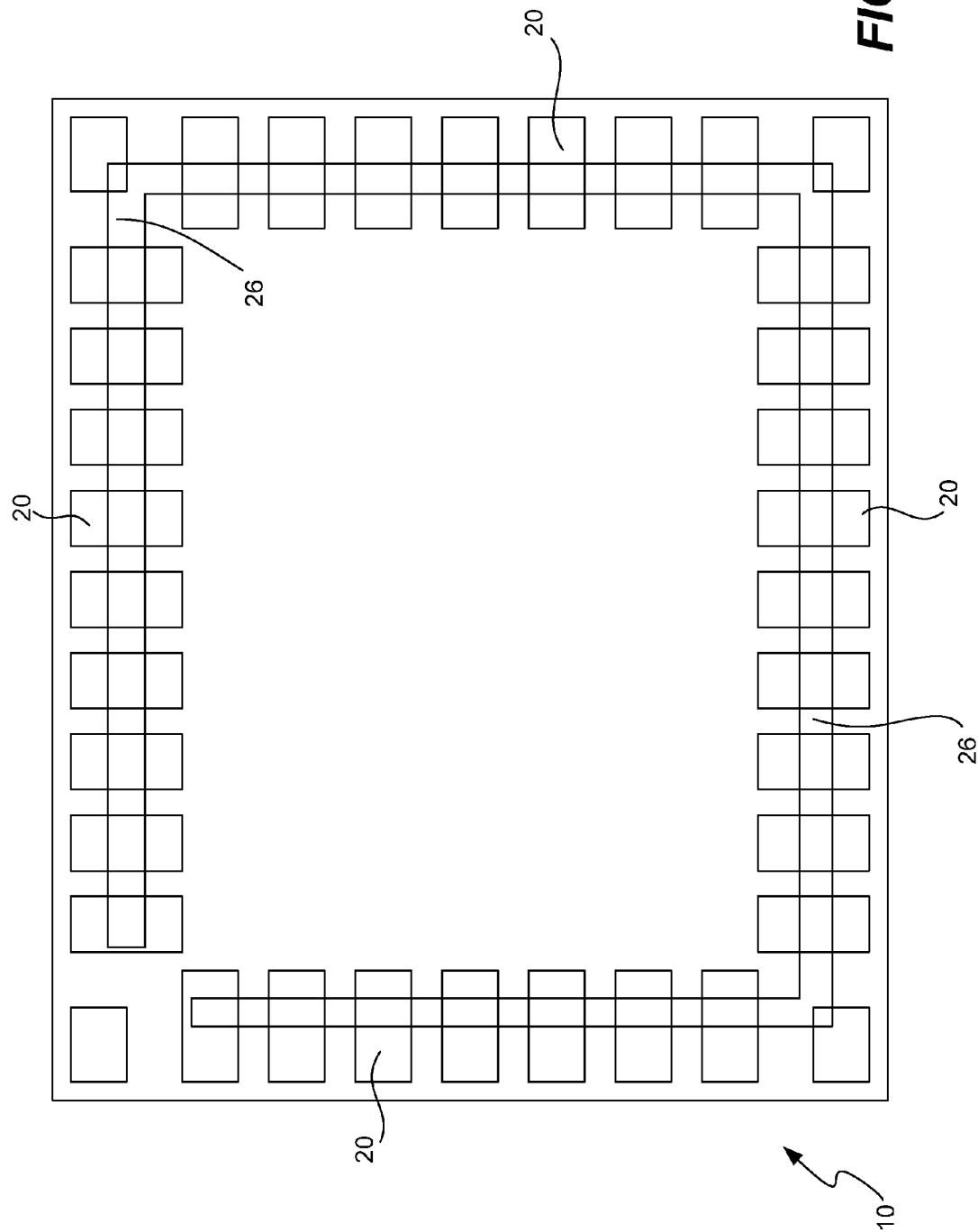

FIGS. 4A and 4B illustrate various pattern arrangements of magnetic core inductors 20 and inductor coil 26 of the inductors before the protective layer 34 and the magnetic layer 36 are fabricated thereon. In FIG. 4A, the magnetic core inductors 20 are arranged in a chevron pattern in the four corners of the die 10 while the coil 26 is a multi-turn coil. In FIG. 4B, the magnetic core inductors 20 are positioned around the periphery of the die 10, while the coil 26 makes a single turn. In each embodiment, the magnetic core inductor members 20 are laminations perpendicular to the direction of current flow through the inductor coil 26. It should be noted that these two embodiments are exemplary and in no way should they be construed as limiting. In accordance with the present invention, the layout of the inductors 20 and coils 26 is arbitrary and can be done in any desirable manner.

Figure 5:
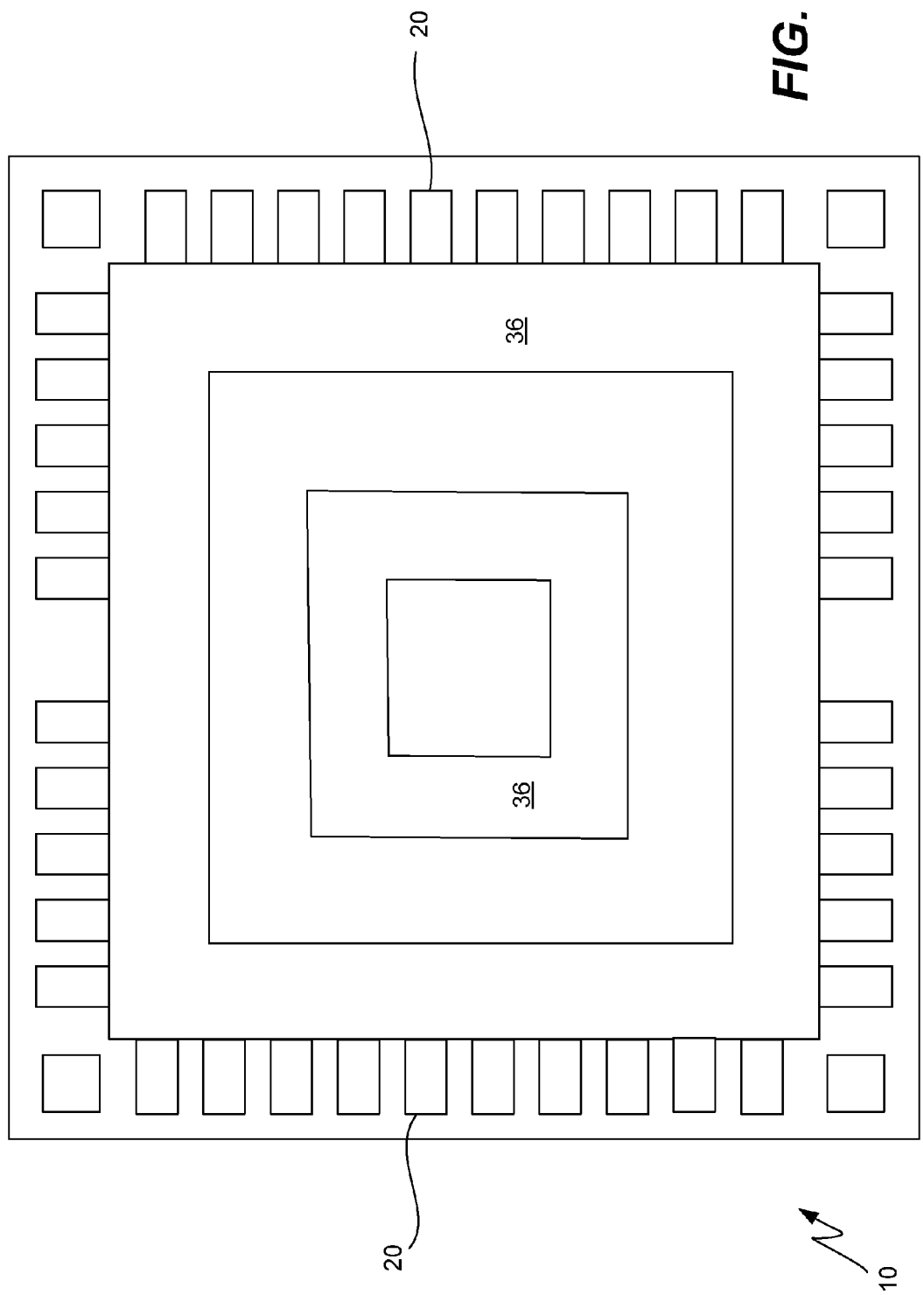
FIG. 5 illustrates a plated magnetic layer formed over the magnetic core inductors of either FIG. 4A or 4B according to the present invention.

Referring to FIG. 5, two segments of the plated magnetic layer 36 is shown formed over the magnetic core inductors of either FIG. 4A or 4B is shown. In this example, the two segments 36 have been patterned to form two concentric squares over the underlying coil 36 and magnetic core inductors 20. It should be understood, however, that the magnetic layer 36 can be patterned to virtually any desirable shape and should not be limited to the specific embodiment illustrated herein.

While this invention has been described in terms of several preferred embodiments, there are alteration, permutations, and equivalents, which fall within the scope of this invention. It should also be noted that there are many alternative ways of implementing the methods and apparatuses of the present invention. For example, the steps of the present invention may be used to form a plurality of high value inductors 10 across many die on a semiconductor wafer. It is therefore intended that the following appended claims be interpreted as including all such alterations, permutations, and equivalents as fall within the true spirit and scope of the present invention.

What is claimed is:

1. An apparatus, comprising:
    an integrated circuit die with power regulation circuitry fabricated thereon;
    a switching node contact in electrical connection with the power regulation circuitry on the integrated circuit;
    an interconnect dielectric layer formed over the power regulation circuitry and the switching node contact of the integrated circuit;
    a plated plurality of magnetic core inductor members formed on the interconnect dielectric, arranged in a chevron shaped pattern in each of the four corners of the integrated circuit die;
    a multi turn inductor coil formed over the plurality of magnetic core inductor members, wherein the plurality of magnetic core inductor members are laminations perpendicular to the direction of current flow through the inductor coil at each intersection of the inductor coil and the plurality of magnetic core inductor members;
    a second dielectric layer formed over the inductor coil; and
    a plated magnetic layer formed over the second dielectric, wherein the plated magnetic layer is formed over but not under the inductor coil in a pattern of concentrically formed shapes one within the other and at differing distances from a common center point, and wherein no plated magnetic layer is formed under the inductor coil.

2. The apparatus of claim 1, further comprising an electrical connection between the inductor coil and the switching node.

3. The apparatus of claim 1, wherein the inductor coil is copper.

4. The apparatus of claim 1, wherein the magnetic core inductor members are NiFe or NiFeCo.

5. The apparatus of claim 1, wherein the plated magnetic layers are either NiFe or NiFeCo.

6. The apparatus of claim 1, wherein the apparatus is formed on a semiconductor wafer including a plurality of dice.

7. The apparatus of claim 1, wherein the plated magnetic layer formed over the second dielectric comprises a plurality of segmented portions that are separated by one or more gaps between magnetic layer material.

8. The apparatus of claim 1, wherein said plurality of magnetic core inductor members comprises a photo resist layer patterned with a plurality of molds therein that are filled with a plated magnetic core inductor material.

9. The apparatus of claim 1, wherein said plated magnetic layer is further formed substantially between individual portions of said inductor coil.

10. A semiconductor wafer including a plurality of dice, each of the plurality of dice comprising:
    power circuitry;
    a plurality of inductors in electrical contact with the power circuitry, wherein each of the plurality of inductors includes:
        a plurality of magnetic core inductor members on an interconnect dielectric layer, wherein the plurality of magnetic core inductor members includes a plurality of chevron shaped members of NiFe or NiFeCo patterned and located in each of the corners of each of the die on the wafer surface, and
        a plurality of inductor coils formed over the plurality of magnetic core inductor members over each die on the wafer respectively, wherein the plurality of magnetic core inductor members are laminations perpendicular to the direction of current flow through the inductor coils at each intersection of the inductor coil and the plurality of magnetic core inductor members; and
    a plated magnetic layer formed over the plurality of inductor coils, wherein no plated magnetic layer is formed under the plurality of inductor coils, and wherein said plated magnetic layer comprises a pattern of concentrically formed shapes one within the other and at differing distances from a common center point.

11. The semiconductor wafer of claim 10, wherein the plurality of inductor coils includes a planarization surface over the plurality of magnetic core inductor members on the wafer surface.

12. The semiconductor wafer of claim 11, wherein the planarization surface includes a spin-on BCB or SU8 material.

13. The semiconductor wafer of claim 10, wherein the plated magnetic layer formed over the second dielectric comprises a plurality of segmented portions that are separated by one or more gaps between magnetic layer material.

14. An apparatus, comprising:
    an integrated circuit with power regulation circuitry fabricated thereon;
    a switching node contact in electrical connection with the power regulation circuitry on the integrated circuit;
    an interconnect dielectric layer formed over the power regulation circuitry and the switching node contact of the integrated circuit;
    a plurality of chevron shaped magnetic core inductor members formed on the interconnect dielectric, arranged in each of the corners of the integrated circuit;
    a multi turn inductor coil formed over the plurality of magnetic core inductor members, wherein the plurality of magnetic core inductor members are laminations perpendicular to the direction of current flow through the inductor coil at each intersection of the inductor coil and the plurality of magnetic core inductor members; and a segmented, plated magnetic layer formed over the second dielectric over the inductor coil, wherein at least some of the segmented portions of the segmented, plated magnetic layer are separated by one or more gaps between magnetic layer material, and wherein said segmented, plated magnetic layer comprises a pattern of concentrically formed shapes one within the other and at differing distances from a common center point.

15. The apparatus of claim 4, wherein said switching node connects said inductor coil with said power regulation circuitry.

16. The apparatus of claim 14, wherein the segmentation of said plated magnetic layer is configured to minimize eddy currents and skin related impedance roll off at high frequencies of operation.

17. An apparatus comprising:
   an integrated circuit with power regulation circuitry fabricated thereon;
   a switching node contact in electrical connection with the power regulation circuitry on the integrated circuit;
   an interconnect dielectric layer formed over the power regulation circuitry and the switching node contact of the integrated circuit;
   a plurality of chevron shaped magnetic core inductor members formed on the interconnect dielectric, arranged in each of the corners of the integrated circuit, wherein said plurality of magnetic core inductor members comprises a photo resist layer patterned with a plurality of molds therein that are filled with a magnetic core inductor material;
   an inductor coil formed over the plurality of magnetic core inductor members;
   a second dielectric layer formed over the inductor coil; and
   a plated magnetic layer formed over the second dielectric, wherein the plated magnetic layer is formed over but not under the inductor coil, and wherein no plated magnetic layer is formed under the inductor coil; and
   an electrical connection between the inductor coil and the switching node, wherein said electrical connection comprises a via filled with a conductive material that extends from the inductor coil to the switching node.

18. A semiconductor wafer including a plurality of dice, each of the plurality of dice comprising:
   power circuitry;
   a switching node in electrical connection with the power circuitry;
   a plurality of inductors in electrical contact with the power circuitry, wherein each of the plurality of inductors includes:
   a plurality of magnetic chevron shaped core inductor members on an interconnect dielectric layer, arranged in each of the corners of each of the plurality of dice, wherein the plurality of magnetic chevron shaped core inductor members includes a photo resist layer patterned with a plurality of molds therein that are filled with a magnetic core inductor material, and
   a plurality of inductor coils formed over the plurality of magnetic core inductor members, wherein the plurality of inductor coils includes a planarization surface over the plurality of magnetic core inductor members on the wafer surface;
   a plated magnetic layer formed over the plurality of inductor coils, wherein no plated magnetic layer is formed under the plurality of inductor coils, and wherein said plated magnetic layer comprises a plurality of segmented portions that are separated by one or more gaps between magnetic layer material; and
   an electrical connection comprising a via filled with a conductive material that extends from the inductor coil to the switching node.

* * * * *